(12) United States Patent
Shibata et al.

(10) Patent No.: US 11,990,542 B2
(45) Date of Patent: May 21, 2024

(54) NITRIDE SEMICONDUCTOR DEVICE

(71) Applicant: PANASONIC CORPORATION, Osaka (JP)

(72) Inventors: Daisuke Shibata, Kyoto (JP); Satoshi Tamura, Osaka (JP); Masahiro Ogawa, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 409 days.

(21) Appl. No.: 17/414,253

(22) PCT Filed: Nov. 25, 2019

(86) PCT No.: PCT/JP2019/046003
§ 371 (c)(1),
(2) Date: Jun. 15, 2021

(87) PCT Pub. No.: WO2020/137303
PCT Pub. Date: Jul. 2, 2020

(65) Prior Publication Data
US 2022/0059660 A1    Feb. 24, 2022

(30) Foreign Application Priority Data

Dec. 27, 2018 (JP) ................................. 2018-245063

(51) Int. Cl.
*H01L 29/778* (2006.01)
*H01L 29/20* (2006.01)
(Continued)

(52) U.S. Cl.
CPC ...... *H01L 29/7788* (2013.01); *H01L 29/2003* (2013.01); *H01L 29/205* (2013.01); *H01L 29/7789* (2013.01); *H01L 29/7802* (2013.01)

(58) Field of Classification Search
CPC .......................... H01L 29/7788; H01L 29/7789
See application file for complete search history.

(56) References Cited

U.S. PATENT DOCUMENTS

| | | | |
|---|---|---|---|
| 2006/0220060 A1 | 10/2006 | Nakata et al. | |
| 2012/0181548 A1* | 7/2012 | Okada | H01L 29/7788 257/76 |
| 2016/0329421 A1* | 11/2016 | Shibata | H01L 29/7788 |

FOREIGN PATENT DOCUMENTS

| | | | |
|---|---|---|---|
| JP | 2006-286942 A | | 10/2006 |
| JP | 2011155221 A | * | 8/2011 |
| JP | 4916671 B2 | | 4/2012 |

OTHER PUBLICATIONS

H.-C. Chiu et al., "Effect of various Fe-doped AlGaN buffer layer of AlGaN/GaN HEMTs on Si substrate," J. Vac. Sci. Technol. B 35(4), 041205, Jul./Aug. 2017. (Year: 2017).*

(Continued)

*Primary Examiner* — Peter M Albrecht
(74) *Attorney, Agent, or Firm* — Rimon P.C.

(57) ABSTRACT

A nitride semiconductor device includes: a substrate; an n-type drift layer; a p-type blocking layer; a gate opening which penetrates through the blocking layer to the drift layer; an electron transport layer and an electron supply layer provided on an inner face of the gate opening; a gate electrode above the electron supply layer and covering the gate opening; a source opening penetrating through the electron supply layer and the electron transport layer to the blocking layer; a source electrode covering the source opening, the source electrode being connected to the electron supply layer, the electron transport layer, and the blocking layer; and a drain electrode on a side of the substrate opposite from a side on which the blocking layer is located. A bottom face of the gate electrode is closer to the drain electrode than a bottom face of the blocking layer is.

4 Claims, 8 Drawing Sheets

(51) Int. Cl.
H01L 29/205 (2006.01)
H01L 29/78 (2006.01)

(56) References Cited

OTHER PUBLICATIONS

International Search Report and Written Opinion issued in International Patent Application No. PCT/JP2019/046003, dated Feb. 10, 2020; with partial English translation.

* cited by examiner

NITRIDE SEMICONDUCTOR DEVICE

CROSS-REFERENCE OF RELATED APPLICATIONS

This application is the U.S. National Phase under 35 U.S.C. § 371 of International Patent Application No. PCT/JP2019/046003, filed on Nov. 25, 2019, which in turn claims the benefit of Japanese Application No. 2018-245063, filed on Dec. 27, 2018, the entire disclosures of which Applications are incorporated by reference herein.

TECHNICAL FIELD

The present disclosure relates to a nitride semiconductor device.

BACKGROUND ART

Nitride semiconductors, typified by gallium nitride (GaN) and aluminum nitride (AlN), are wide-gap semiconductors which have large band-gaps, and feature greater breakdown fields and higher electron saturated drift velocities than gallium arsenide (GaAs) semiconductors or silicon (Si) semiconductors. As such, power transistors using nitride semiconductors, which are useful in achieving higher outputs and breakdown voltages, are being researched and developed.

For example, PTL 1 discloses a vertical transistor including a GaN semiconductor layer. According to the vertical transistor described in PTL 1, a barrier layer constituted by a p-type GaN semiconductor is positioned between a source electrode and a drain electrode, which suppresses a worsening of the pinch-off characteristics.

CITATION LIST

Patent Literature

[PTL 1]
Japanese Patent No. 4916671

SUMMARY OF INVENTION

Technical Problem

However, with the above-described conventional vertical transistor, there is a problem in that leakage current is high when the transistor is in an off state. The above-described conventional vertical transistor also has a problem in that the breakdown voltage is low.

Accordingly, the present disclosure provides a nitride semiconductor device which can reduce leakage current when off and which has a high breakdown voltage.

Solution to Problem

To solve the aforementioned problem, a nitride semiconductor device according to an aspect of the present disclosure includes: a substrate; a first nitride semiconductor layer above the substrate, the first nitride semiconductor layer being of an n-type; a second nitride semiconductor layer above the first nitride semiconductor layer, the second nitride semiconductor layer being of a p-type; a first opening which penetrates through the second nitride semiconductor layer to the first nitride semiconductor layer; an electron transport layer and an electron supply layer disposed on an inner face of the first opening, in the stated order from a side on which the substrate is located; a gate electrode above the electron supply layer and covering the first opening; a second opening at a position distanced from the first opening, the second opening penetrating through the electron supply layer and the electron transport layer to the second nitride semiconductor layer; a source electrode covering the second opening, the source electrode being connected to the electron supply layer, the electron transport layer, and the second nitride semiconductor layer; and a drain electrode on a side of the substrate opposite from a side of the substrate on which the first nitride semiconductor layer is located. A bottom face of the gate electrode is closer to the drain electrode than a bottom face of the second nitride semiconductor layer is.

Advantageous Effects of Invention

According to the present disclosure, a nitride semiconductor device which can reduce leakage current when off and which has a high breakdown voltage can be provided.

DESCRIPTION OF EMBODIMENTS

Overview of the Present Disclosure

Figure 1:
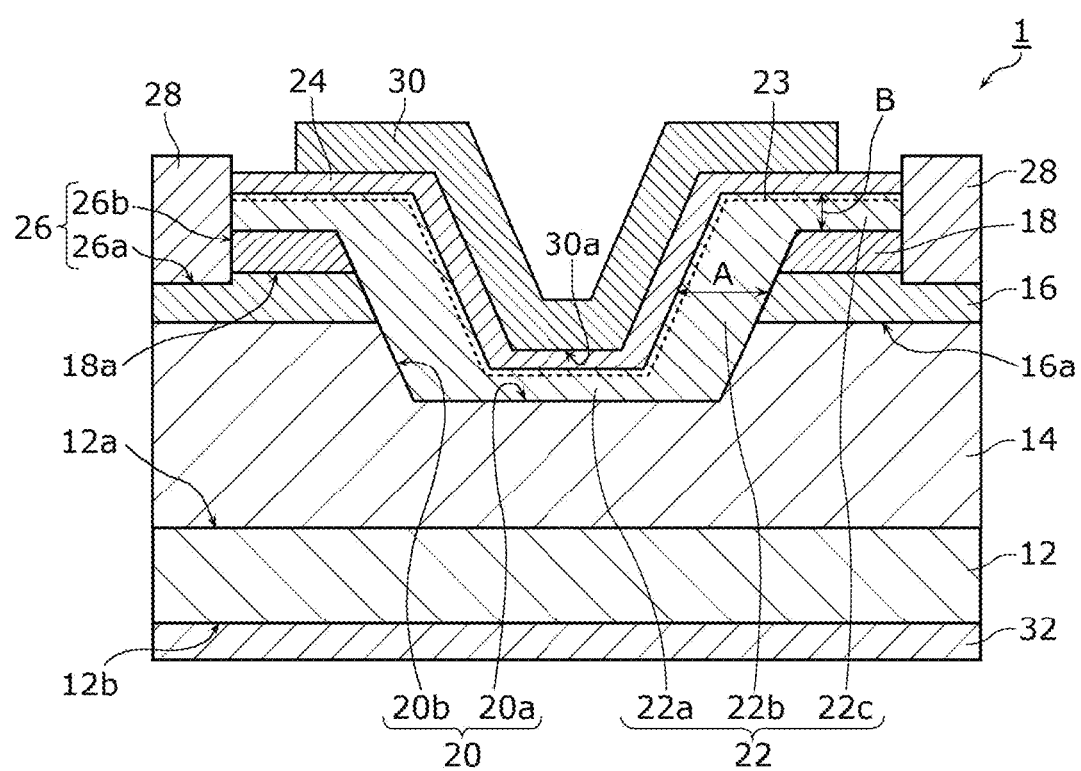
FIG. 1 is a cross-sectional view of a nitride semiconductor device according to Embodiment 1 of the present disclosure.

The inventors of the present disclosure discovered that the conventional vertical transistor described above in the "Background Art" section has the following problems.

In the above-described conventional vertical transistor, an opening is formed penetrating through the barrier layer, and an electron transport layer, an electron supply layer, and a gate electrode are formed, in that order, covering the opening. In the conventional vertical transistor, a bottom part of the gate electrode is further from a drain electrode than a bottom part of the barrier layer.

Accordingly, when the transistor is in an off state, a high voltage is applied across the source and drain, and an electrical field concentrates at an end part of the barrier layer in the opening. The barrier layer is formed from p-type GaN, and thus a pn junction is formed at the area of contact with the electron transport layer constituted by GaN. Here, the electron transport layer is formed through crystal regrowth performed after forming the opening, and thus the pn junction part includes a regrown interface. Impurities (Si in particular) are present at the regrown interface at at least a set concentration, and thus a breakdown field of the pn junction is weaker than that of an ideal pn junction. As such, according to the conventional vertical transistor, leakage current cannot be sufficiently reduced when the transistor is off.

To solve the aforementioned problem, a nitride semiconductor device according to an aspect of the present disclosure includes: a substrate; a first nitride semiconductor layer above the substrate, the first nitride semiconductor layer being of an n-type; a second nitride semiconductor layer above the first nitride semiconductor layer, the second nitride semiconductor layer being of a p-type; a first opening which penetrates through the second nitride semiconductor layer to the first nitride semiconductor layer; an electron transport layer and an electron supply layer disposed on an inner face of the first opening, in the stated order from a side on which the substrate is located; a gate electrode above the electron supply layer and covering the first opening; a second opening at a position distanced from the first opening, the second opening penetrating through the electron supply layer and the electron transport layer to the second nitride semiconductor layer; a source electrode covering the second opening, the source electrode being connected to the electron supply layer, the electron transport layer, and the second nitride semiconductor layer; and a drain electrode on a side of the substrate opposite from a side of the substrate on which the first nitride semiconductor layer is located. A bottom face of the gate electrode is closer to the drain electrode than a bottom face of the second nitride semiconductor layer is.

Because the bottom face of the gate electrode is closer to the drain electrode than the bottom face of the p-type second nitride semiconductor layer, when a high voltage is applied across the source-drain while the nitride semiconductor device is off, it is easy for an electrical field to concentrate at the bottom face of the gate electrode, which makes it possible to alleviate electrical field concentration at end parts of the second nitride semiconductor layer. Thus according to this aspect, a nitride semiconductor device which can reduce leakage current when off and which has a high breakdown voltage can be realized.

Additionally, for example, the gate electrode may include a metal layer including a metal material, and a third nitride semiconductor layer between the metal layer and the electron supply layer, the third nitride semiconductor layer being of a p-type; and a bottom face of the third nitride semiconductor layer may be closer to the drain electrode than the bottom face of the second nitride semiconductor layer is.

Through this, the carrier concentration directly below the gate electrode can be reduced by the p-type third nitride semiconductor layer. Reducing the carrier concentration raises the potential of the channel, which makes it possible to shift the threshold voltage of the nitride semiconductor device toward the positive side. Accordingly, the nitride semiconductor device according to this aspect can function as a normally-off FET (Field Effect Transistor).

Additionally, for example, the nitride semiconductor device according to one aspect of the present disclosure may further include a high-resistance layer between the second nitride semiconductor layer and the electron transport layer on the inner face of the first opening, the high-resistance layer having a resistance higher than a resistance of the second nitride semiconductor layer.

Because the high-resistance layer is provided between the p-type second nitride semiconductor layer and the electron transport layer, when the nitride semiconductor device is on, a narrowing of the channel caused by a barrier layer extending from the second nitride semiconductor layer toward the electron transport layer can be suppressed. This makes it possible to achieve high-current operations in the nitride semiconductor device, and reduce the on-resistance.

Note that providing the high-resistance layer also suppresses spreading of the barrier layer when the nitride semiconductor layer is off. This results in a lower breakdown voltage in an off state than when the high-resistance layer is not provided. In contrast, according to this aspect, the bottom face of the gate electrode is closer to the drain electrode than the bottom face of the p-type second nitride semiconductor layer, and thus as described above, the breakdown voltage can be increased. In other words, a drop in the breakdown voltage can be suppressed even if the high-resistance layer is provided.

Additionally, for example, the high-resistance layer may be a nitride semiconductor layer containing Fe.

Accordingly, the high-resistance layer can be easily formed through Fe ion implantation, for example.

Additionally, for example, the first nitride semiconductor layer may include a first layer and a second layer above the first layer, the second layer having a lower donor concentration than the first layer.

Accordingly, when a high voltage is applied to the drain electrode in an off state, a barrier layer is prompted to form extending from the second nitride semiconductor layer to within the first nitride semiconductor layer, and thus electrical field concentration at the bottom face of the second nitride semiconductor layer or the bottom face of the gate electrode can be further alleviated.

Embodiments of the present disclosure will be described in detail hereinafter with reference to the drawings.

Note that the following embodiments describe comprehensive or specific examples of the present disclosure. The numerical values, shapes, materials, constituent elements, arrangements and connection states of constituent elements, steps, orders of steps, and the like in the following embodiments are merely examples, and are not intended to limit the present disclosure. Additionally, of the constituent elements in the following embodiments, constituent elements not denoted in the independent claims will be described as optional constituent elements.

Additionally, the drawings are schematic diagrams, and are not necessarily exact illustrations. As such, the scales and so on, for example, are not necessarily consistent from drawing to drawing. Furthermore, configurations that are substantially the same are given the same reference signs in the drawings, and redundant descriptions will be omitted or simplified.

Additionally, in the present specification, terms indicating relationships between elements, such as "parallel" or "perpendicular", terms indicating the shapes of elements, such as "rectangular", and numerical value ranges do not express the items in question in the strictest sense, but rather include substantially equivalent ranges, e.g., differences of several percent, as well.

Additionally, in the present specification, terms such as "above" and "below" do not indicate the upward direction (vertically upward) and the downward direction (vertically downward) in an absolute spatial sense, but rather are used as terms defining relative positional relationships based on layering orders in layered configurations. Moreover, terms such as "above" and "below" are used not only in cases where two constituent elements are disposed with an interval therebetween and another constituent element is present between the stated two constituent elements, but also in cases where two constituent elements are disposed in close contact with each other.

In the present specification, "AlGaN" refers to an $Al_xGa_{1-x}N$ ternary mixed crystal (where $0 \le x \le 1$). Hereinafter, for multidimensional mixed crystals, the arrangements of the respective constituent element signs are abbreviated, e.g., AlInN, GaInN and the like. For example, $Al_xGa_{1-x-y}In_yN$ (where $0 \le x \le 1$, $0 \le y \le 1$, and $0 \le x+y \le 1$), which is an example of a nitride semiconductor, is abbreviated as "AlGaInN".

Embodiment 1

First, the configuration of a nitride semiconductor device according to Embodiment 1 will be described with reference to FIG. 1.

FIG. 1 is a cross-sectional view of nitride semiconductor device 1 according to the present embodiment. As illustrated in FIG. 1, nitride semiconductor device 1 includes substrate 12, drift layer 14, blocking layer 16, high-resistance layer 18, gate opening 20, electron transport layer 22, electron supply layer 24, source opening 26, source electrode 28, gate electrode 30, and drain electrode 32.

In the present embodiment, nitride semiconductor device 1 is a device having a layered structure of semiconductor layers that take a nitride semiconductor such as GaN or AlGaN as a primary component. Specifically, nitride semiconductor device 1 has a heterostructure of an AlGaN film and a GaN film.

In the heterostructure of an AlGaN film and a GaN film, highly-concentrated two-dimensional electron gas (2DEG) 23 is produced at the hetero interface due to spontaneous polarization or piezoelectric polarization on a (0001) plane. The device therefore has a characteristic where a sheet carrier concentration of at least $1 \times 10^{13}$ $cm^{-2}$ is achieved at the interface, even in an undoped state.

Nitride semiconductor device 1 according to the present embodiment is a field effect transistor (FET) which uses two-dimensional electron gas 23 produced at the AlGaN/GaN hetero interface as a channel. Specifically, nitride semiconductor device 1 is what is known as a vertical FET.

Nitride semiconductor device 1 according to the present embodiment is a normally-off FET. In nitride semiconductor device 1, source electrode 28 is grounded (i.e., is at a potential of 0 V), and a positive potential is applied to drain electrode 32, for example. The potential applied to drain electrode 32 is at least 100 V and no more than 1200 V, for example, but is not limited thereto. When nitride semiconductor device 1 is off, 0 V or a negative potential (e.g., −5 V) is applied to gate electrode 30. When nitride semiconductor device 1 is on, a positive potential (e.g., +5 V) is applied to gate electrode 30. Note that nitride semiconductor device 1 may be a normally-on FET.

Note that when nitride semiconductor device 1 is used as a switching element, a resistance element or an inductor element is connected in series with drain electrode 32 or source electrode 28. Accordingly, when nitride semiconductor device 1 has turned on, a resistance across the source-drain of nitride semiconductor device 1 drops, and thus most of the voltage applied across the source-drain is applied to the resistance element or the inductor element. As such, the potential actually applied to drain electrode 32 decreases to approximately 0.5 V.

The various constituent elements included in nitride semiconductor device 1 will be described hereinafter.

Substrate 12 is a substrate constituted by a nitride semiconductor, and as illustrated in FIG. 1, has first main surface 12a and second main surface 12b which face in opposite directions. First main surface 12a is a main surface on a side where drift layer 14 is formed. Specifically, first main surface 12a substantially coincides with the c plane. Second main surface 12b is a main surface on a side where drain electrode 32 is formed. Seen in plan view, the shape of substrate 12 is a rectangle, for example, but the shape is not limited thereto.

Substrate 12 is, for example, a substrate formed from $n^+$-type GaN with a thickness of 300 μm and a carrier concentration of $1 \times 10^{18}$ $cm^{-3}$. Note that "n-type" and "p-type" indicate conductivity types of semiconductors. "$n^+$-type" indicates a state where an n-type dopant has been excessively added to a semiconductor, i.e., a so-called "heavily-doped" state. "$n^-$-type" indicates a state where an n-type dopant has been insufficiently added to a semiconductor, i.e., a so-called "lightly-doped" state. The same applies to "$p^+$-type" and "$p^-$-type".

Note that substrate 12 need not be a nitride semiconductor substrate. For example, substrate 12 may be a silicon (Si) substrate, a silicon carbide (SiC) substrate, a zinc oxide (ZnO) substrate, or the like.

Drift layer 14 is an example of an n-type first nitride semiconductor layer provided above substrate 12. Drift layer 14 is, for example, a film formed from $n^-$-type GaN with a thickness of 8 μm, for example. A donor concentration of drift layer 14 is, for example, in a range of at least $1 \times 10^{15}$ $cm^{-3}$ and no more than $1 \times 10^{17}$ $cm^{-3}$, e.g., $1 \times 10^{16}$ $cm^{-3}$. Additionally, a carbon concentration (C concentration) of drift layer 14 is in a range of at least $1 \times 10^{15}$ $cm^{-3}$ and no more than $2 \times 10^{17}$ $cm^{-3}$.

Drift layer 14 is provided so as to be in contact with first main surface 12a of substrate 12, for example. Drift layer 14 is formed on first main surface 12a of substrate 12 through crystal growth achieved by metalorganic vapor-phase epitaxy (MOVPE), for example.

Blocking layer 16 is an example of a p-type second nitride semiconductor layer provided above drift layer 14. Blocking layer 16 is, for example, a film formed from p-type GaN with a thickness of 400 nm and a carrier concentration of $1 \times 10^{17}$ $cm^{-3}$. Blocking layer 16 is provided so as to be in contact with an upper face of drift layer 14. Blocking layer 16 is formed on drift layer 14 through crystal growth achieved by MOVPE or the like, for example. Note that blocking layer 16 may be formed by implanting magnesium (Mg) into an i-type GaN film which has been formed through deposition.

Blocking layer 16 suppresses leakage current between source electrode 28 and drain electrode 32. For example, when a reverse voltage is applied to a pn junction formed by blocking layer 16 and drift layer 14, and more specifically, when drain electrode 32 is at a higher potential than source electrode 28, a barrier layer extends along drift layer 14. This makes it possible to increase the breakdown voltage of nitride semiconductor device 1. As described above, in the present embodiment, source electrode 28 is at a higher potential than drain electrode 32 in both an off and an on state. This realizes an increase in the breakdown voltage of nitride semiconductor device 1.

As illustrated in FIG. 1, in the present embodiment, blocking layer 16 contacts source electrode 28. Accordingly, blocking layer 16 is fixed to the same potential as source electrode 28.

High-resistance layer 18 is an example of a high-resistance layer provided above blocking layer 16. High-resistance layer 18 has a higher resistance than blocking layer 16. High-resistance layer 18 is formed from an insulative or semi-insulative nitride semiconductor. High-resistance layer 18 is, for example, a film formed from undoped GaN having a thickness of 200 nm. High-resistance layer 18 is provided so as to be in contact with blocking layer 16. High-resistance layer 18 is formed on blocking layer 16 through crystal growth achieved by MOVPE or the like, for example.

Note that "undoped" means that the material is not doped with a dopant such as Si or Mg, which changes the polarity of GaN to n-type or p-type. In the present embodiment, high-resistance layer 18 is doped with carbon (C). Specifically, a C concentration of high-resistance layer 18 is higher than the C concentration of blocking layer 16.

Additionally, high-resistance layer 18 may contain silicon (Si) or oxygen (O) which intermix during film formation. In this case, the C concentration of high-resistance layer 18 is higher than the silicon concentration (Si concentration) or the oxygen concentration (O concentration). For example, the C concentration of high-resistance layer 18 is at least $3 \times 10^{17}$ cm$^{-3}$, but may be at least $1 \times 10^{18}$ cm$^{-3}$. The Si concentration or O concentration of high-resistance layer 18 is, for example, no more than $5 \times 10^{16}$ cm$^{-3}$, but may be no more than $2 \times 10^{16}$ cm$^{-3}$.

Note that aside from carbon, high-resistance layer 18 may be formed by ion implantation using magnesium (Mg), iron (Fe), boron (B), or the like. Other ion types may be used as long as they are ion types with which the resistance of the GaN can be increased.

Here, if, for example, nitride semiconductor device 1 does not include high-resistance layer 18, a parasitic npn structure constituted by electron transport layer 22, the p-type blocking layer 16, and the n-type drift layer 14, i.e., a parasitic bipolar transistor, will be present between source electrode 28 and drain electrode 32. As such, if, when nitride semiconductor device 1 is off, a current flows in the p-type blocking layer 16, the parasitic bipolar transistor will turn on, and there is thus a risk that the breakdown voltage of nitride semiconductor device 1 will drop. In this case, nitride semiconductor device 1 is more likely to malfunction. In the present embodiment, providing high-resistance layer 18 makes it possible to suppress situations in which a parasitic npn structure is formed, and suppress malfunctions in nitride semiconductor device 1.

A layer for suppressing a situation in which p-type impurities, such as Mg, disperse from blocking layer 16 may be provided on an upper face of high-resistance layer 18. For example, a 20 nm-thick AlGaN layer may be provided on high-resistance layer 18.

Gate opening 20 is an example of a first opening which penetrates through blocking layer 16 to drift layer 14. Gate opening 20 penetrates through both high-resistance layer 18 and blocking layer 16. Bottom face 20a of gate opening 20 corresponds to an upper face of drift layer 14. As illustrated in FIG. 1, bottom face 20a is located lower than bottom face 16a of blocking layer 16. Note that bottom face 16a of blocking layer 16 corresponds to an interface between blocking layer 16 and drift layer 14. Bottom face 20a is parallel to first main surface 12a of substrate 12.

In the present embodiment, gate opening 20 is formed so that the area of the opening increases with distance from substrate 12. Specifically, side face 20b of gate opening 20 is inclined at an angle. As illustrated in FIG. 1, the cross-sectional shape of gate opening 20 is an inverted trapezoid, and more specifically, an inverted isosceles trapezoid.

An inclination angle of side face 20b relative to bottom face 20a is in a range of at least 30° and no more than 45°, for example. Having the inclination angle at no more than 45° brings side face 20b closer to the c plane, which makes it possible to improve the film properties of electron transport layer 22 and the like formed along side face 20b through crystal regrowth. Having the inclination angle at at least 30° suppresses a situation in which gate opening 20 becomes too large, which makes nitride semiconductor device 1 smaller.

Gate opening 20 is formed by first forming drift layer 14, blocking layer 16, and high-resistance layer 18 in that order on first main surface 12a of substrate 12, and then removing part of each of high-resistance layer 18 and blocking layer 16 such that drift layer 14 is partially exposed. At this time, bottom face 20a of gate opening 20 is formed lower than bottom face 16a of blocking layer 16 by removing a part, having a predetermined thickness, of a surface layer of drift layer 14.

The removal of high-resistance layer 18 and blocking layer 16 is performed by applying and patterning a resist, and performing dry etching. Specifically, the resist is baked after being patterned so that end parts of the resist are inclined. Thereafter, by performing dry etching, the shape of the resist is transferred, which forms gate opening 20 in which side face 20b is inclined.

Electron transport layer 22 is an example of a first regrowth layer provided along an inner face of gate opening 20. Specifically, electron transport layer 22 is provided along bottom face 20a and side face 20b of gate opening 20, and on an upper face of high-resistance layer 18. Electron transport layer 22 is, for example, a film formed from undoped GaN having a thickness of 150 nm. Although undoped here, electron transport layer 22 may be given n-type conductivity by being doped with Si or the like.

Electron transport layer 22 makes contact with drift layer 14 at bottom face 20a and side face 20b of gate opening 20. Electron transport layer 22 makes contact with blocking layer 16 and high-resistance layer 18 at side face 20b of gate opening 20. Furthermore, electron transport layer 22 makes contact with the upper face of high-resistance layer 18. Electron transport layer 22 is formed through crystal regrowth after gate opening 20 has been formed.

Electron transport layer 22 has a channel. Specifically, two-dimensional electron gas 23 is produced near the interface between electron transport layer 22 and electron supply layer 24. Two-dimensional electron gas 23 functions as the channel of electron transport layer 22. In FIG. 1, two-dimensional electron gas 23 is schematically indicated by a broken line. Two-dimensional electron gas 23 curves along the interface between electron transport layer 22 and electron supply layer 24, i.e., along the inner face of gate opening 20.

Additionally, although not illustrated in FIG. 1, an approximately 1 nm-thick AlN film may be provided, as a second regrowth layer, between electron transport layer 22 and electron supply layer 24. The AlN film suppresses alloy scattering, which makes it possible to improve channel mobility.

Electron supply layer 24 is an example of a third regrowth layer provided along an inner face of gate opening 20. Electron transport layer 22 and electron supply layer 24 are provided in that order from the substrate 12 side. Electron supply layer 24 is formed on an upper face of electron transport layer 22 at a substantially uniform thickness. Electron supply layer 24 is, for example, a film formed from undoped AlGaN having a thickness of 50 nm. Electron supply layer 24 is formed through crystal regrowth after the process of forming electron transport layer 22.

Electron supply layer 24 forms an AlGaN/GaN hetero interface with electron transport layer 22. Two-dimensional electron gas 23 is produced within electron transport layer 22 as a result. Electron supply layer 24 supplies electrons to the channel formed in electron transport layer 22 (i.e., to two-dimensional electron gas 23).

Source opening 26 is an example of a second opening which penetrates through electron transport layer 22 and electron supply layer 24 to blocking layer 16 at a position distanced from gate opening 20. Source opening 26 also penetrates through high-resistance layer 18. In a plan view, source opening 26 is provided in a location distanced from gate electrode 30.

Bottom face 26a of source opening 26 corresponds to an upper face of blocking layer 16. As illustrated in FIG. 1, bottom face 26a is located lower than bottom face 18a of high-resistance layer 18. Note that bottom face 18a of high-resistance layer 18 corresponds to an interface between high-resistance layer 18 and blocking layer 16. Bottom face 26a is parallel to first main surface 12a of substrate 12.

As illustrated in FIG. 1, source opening 26 is formed so that the area of the opening is constant regardless of distance from substrate 12. Specifically, side face 26b of source opening 26 is perpendicular to bottom face 26a. In other words, the cross-sectional shape of source opening 26 is a rectangle.

Alternatively, like gate opening 20, source opening 26 may be formed so that the area of the opening increases with distance from substrate 12. Specifically, side face 26b of source opening 26 may be inclined at an angle. For example, the cross-sectional shape of source opening 26 may be an inverted trapezoid, and more specifically, an inverted isosceles trapezoid. Here, an inclination angle of side face 26b relative to bottom face 26a is in a range of at least 30° and no more than 60°, for example. For example, the inclination angle of side face 26b of source opening 26 may be greater than the inclination angle of side face 20b of gate opening 20. Having side face 26b inclined at an angle increases the contact area between source electrode 28 and electron transport layer 22 (two-dimensional electron gas 23), which makes it easy to achieve ohmic contact. Note that two-dimensional electron gas 23 is exposed to side face 26b of source opening 26 and is connected to source electrode 28 at the exposed area.

Source opening 26 is formed by etching electron supply layer 24, electron transport layer 22, and high-resistance layer 18 so as to expose blocking layer 16 in a region different from gate opening 20, after the process of forming electron supply layer 24 (i.e., the crystal regrowth process), for example. By also removing a part of the surface layer of blocking layer 16 at this time, bottom face 26a of source opening 26 is formed lower than bottom face 18a of high-resistance layer 18. Source opening 26 is formed in a predetermined shape through, for example, patterning through photolithography, dry etching, and the like.

Source electrode 28 is provided covering source opening 26, and is connected to electron supply layer 24, electron transport layer 22, and blocking layer 16. Specifically, source electrode 28 is provided so as to fill source opening 26, in a position distanced from gate electrode 30. Source electrode 28 makes ohmic contact with electron transport layer 22 and electron supply layer 24. Source electrode 28 is in direct contact with two-dimensional electron gas 23 at side face 26b. Contact resistance between source electrode 28 and two-dimensional electron gas 23 (the channel) can be reduced as a result.

Source electrode 28 is formed using a conductive material such as a metal. For example, a material which makes ohmic contact with an n-type semiconductor layer, such as Ti/Al, can be used as the material of source electrode 28. Source electrode 28 is formed by patterning a conductive film formed through sputtering or vapor deposition, for example.

Gate electrode 30 is provided above electron supply layer 24 so as to cover gate opening 20. In the present embodiment, gate electrode 30 is provided in contact with an upper face of electron supply layer 24. In a plan view, gate electrode 30 completely covers gate opening 20. For example, in the cross-sectional view illustrated in FIG. 1, an end part of gate electrode 30 closest to source electrode 28 is positioned closer to source electrode 28 than an opening end part of gate opening 20 (i.e., an upper end of side face 20b).

Gate electrode 30 is formed using a conductive material such as a metal. Gate electrode 30 is formed using palladium (Pd), for example. Note that a material which is Schottky-connected to an n-type semiconductor can be used as the material of gate electrode 30, and thus a nickel (Ni)-based material, tungsten silicide (WSi), gold (Au), or the like can be used, for example. Gate electrode 30 is formed by patterning a conductive film formed through sputtering or vapor deposition, for example, after electron supply layer 24 has been formed, after source opening 26 has been formed, or after source electrode 28 has been formed.

Drain electrode 32 is provided on the side of substrate 12 opposite from the side on which drift layer 14 is located. Specifically, drain electrode 32 is provided so as to be in contact with second main surface 12b of substrate 12. Drain electrode 32 is formed using a conductive material such as a metal. For example, like source electrode 28, a material which makes ohmic contact with an n-type semiconductor layer, such as Ti/Al, can be used as the material of drain electrode 32. Drain electrode 32 is formed by patterning a conductive film formed through sputtering or vapor deposition, for example.

A characteristic configuration of nitride semiconductor device 1 according to the present embodiment will be described next.

Bottom Face of Gate Electrode

As illustrated in FIG. 1, in the present embodiment, bottom face 30a of gate electrode 30 is closer to drain electrode 32 than bottom face 16a of blocking layer 16. Specifically, bottom face 20a of gate opening 20 is located 0.3 µm deeper (closer to drain electrode 32) than bottom face 16a of blocking layer 16. A total film thickness of electron transport layer 22 and electron supply layer 24, which are formed through regrowth, is 200 nm (=0.2 µm), for example. Accordingly, bottom face 30a of gate electrode 30 is located 0.1 µm closer to drain electrode 32 than bottom face 16a of blocking layer 16.

Through this, an electrical field produced in a vertical direction of nitride semiconductor device 1 by applying a high potential to drain electrode 32 when nitride semiconductor device 1 is off concentrates easily at bottom face 30a of gate electrode 30. Accordingly, electrical field concentration at end parts of blocking layer 16 (specifically, at the interface between blocking layer 16 and electron transport layer 22) can be alleviated.

As described above, impurities such as Si are present at the interface between blocking layer 16 and electron transport layer 22, i.e., side face 20b of gate opening 20, which reduces the strength of the breakdown field. As such, when an electrical field concentrates easily at the end parts of blocking layer 16, the breakdown voltage of nitride semiconductor device 1 will drop.

On the other hand, gate electrode 30 and electron supply layer 24 are Schottky-connected at bottom face 30a of gate electrode 30. Bottom face 30a corresponds to the interface between gate electrode 30 and electron supply layer 24. Unlike the interface between electron transport layer 22 and blocking layer 16 (i.e., side face 20b of gate opening 20), bottom face 30a is not a regrown interface, and as such, impurities such as Si are almost entirely absent. Accordingly, even if an electrical field concentrates at bottom face 30a of gate electrode 30, the breakdown voltage of nitride semiconductor device 1 can be increased more than when an electrical field concentrates at the end parts of blocking layer 16.

Note that the numerical values pertaining to the depth are merely examples, and are not particularly limited. For example, the distance between bottom face 20a of gate opening 20 and bottom face 16a of blocking layer 16, i.e., the depth of gate opening 20 in drift layer 14, may be longer or shorter than 0.3 μm. For example, the distance between bottom face 20a of gate opening 20 and bottom face 16a of blocking layer 16 may be at least 0.5 μm and no more than 2 μm. Likewise, the distance between bottom face 30a of gate electrode 30 and bottom face 16a of blocking layer 16 may be longer or shorter than 0.1 μm. For example, the distance between bottom face 30a of gate electrode 30 and bottom face 16a of blocking layer 16 may be at least 0.3 μm and no more than 1.8 μm.

For example, by bringing bottom face 30a of gate electrode 30 closer to drain electrode 32, electrical field concentration at the end parts of blocking layer 16 can be further alleviated. Additionally, by ensuring bottom face 30a of gate electrode 30 is not brought too close to drain electrode 32, a distance between bottom face 20a of gate opening 20 and drain electrode 32 can be secured, which makes it possible to improve the breakdown voltage.

Additionally, when nitride semiconductor device 1 is off, a barrier layer spreads within electron transport layer 22 from the interface between blocking layer 16 and electron transport layer 22 (side face 20b of gate opening 20). The barrier layer which has spread narrows the channel within electron transport layer 22, which makes it possible to suppress leakage current flowing in the channel when in an off state. Leakage current in nitride semiconductor device 1 can therefore be sufficiently suppressed.

Note that source electrode 28 is connected to blocking layer 16, and the potential of blocking layer 16 is fixed to the source potential. The amount of spread of the barrier layer depends on a potential difference between blocking layer 16 and gate electrode 30, and thus fixing the potential of blocking layer 16 stabilizes the amount of spread of the barrier layer. This stabilizes the leakage current reduction characteristics of nitride semiconductor device 1, which makes it possible to realize nitride semiconductor device 1 having a high reliability.

Film Thickness of Electron Transport Layer

As illustrated in FIG. 1, electron transport layer 22 includes bottom face part 22a provided on bottom face 20a, inclined part 22b provided along side face 20b, and flat part 22c provided on the upper face of high-resistance layer 18. In the present embodiment, length A of inclined part 22b along a direction parallel to substrate 12 is longer than length B of flat part 22c along a thickness direction of substrate 12.

Generally, in a vertical FET formed using a nitride semiconductor material, the GaN crystal growth is performed such that the c plane of the GaN crystals is parallel to first main surface 12a of substrate 12. At this time, the polarization of two-dimensional electron gas 23 is lower at parts inclined relative to the c plane than at parts parallel to the c plane, resulting in reduced carrier concentration. In other words, two-dimensional electron gas 23 has a lower carrier concentration at parts within inclined part 22b than at parts within flat part 22c. Accordingly, the part of two-dimensional electron gas 23 within inclined part 22b is susceptible to the narrowing effect produced by the barrier layer extending from blocking layer 16.

As illustrated in FIG. 1, in the present embodiment, length A of inclined part 22b is longer than length B of flat part 22c. As such, two-dimensional electron gas 23 is further from blocking layer 16 at the part within inclined part 22b than at the part within flat part 22c. Accordingly, the channel narrowing effect of the barrier layer can be suppressed, and thus a drop in the on-resistance can be suppressed.

On the other hand, when the length of electron transport layer 22 in the thickness direction (i.e., the thickness of electron transport layer 22) is short, the depth of source opening 26 also becomes shallow. Thus by making source opening 26 shallower, the process time required to remove film through etching can be shortened. Additionally, making source opening 26 shallow improves the coverage of metal electrodes formed in subsequent processes as well, which reduces the on-resistance.

In this manner, making length A of inclined part 22b shorter than length B of flat part 22c not only enables high-current operations, but also makes it possible to simplify processes and reduce the on-resistance.

End Parts of Gate Electrode

In the present embodiment, a threshold voltage can be adjusted by having gate electrode 30 completely or only partially cover gate opening 20. In other words, the threshold voltage can be adjusted in accordance with the position of the end parts of gate electrode 30.

In a plan view, gate electrode 30 at least partially covers bottom face 20a and side face 20b of gate opening 20, for example. Specifically, in a plan view, gate electrode 30 completely covers bottom face 20a and side face 20b. In other words, in a plan view, gate opening 20 is provided on an inner side of gate electrode 30. When viewed in the cross-section illustrated in FIG. 1, an end part of gate electrode 30 is positioned closer to source electrode 28 than an upper end of side face 20b of gate opening 20, in a direction parallel to substrate 12 (i.e., a left-right direction in the drawing).

In this case, the threshold voltage of nitride semiconductor device 1 is determined by which of a part of gate opening 20 following side face 20b (specifically, the inclined part of two-dimensional electron gas 23) and a flat part on an outer side of gate opening 20 (specifically, the flat part of two-dimensional electron gas 23) has the higher threshold voltage. For example, when the threshold voltage is determined by the flat part of two-dimensional electron gas 23, the distance from blocking layer 16 to two-dimensional electron gas 23 is made longer at the flat part than at the inclined part. Specifically, length A of inclined part 22b of electron transport layer 22 is made longer than length B of flat part 22c. This makes it possible to suppress the influence of depletion from blocking layer 16, and makes it possible to set the threshold voltage at inclined part 22b lower than the threshold voltage at flat part 22c.

Note that in a plan view, gate electrode 30 may be provided on an inner side of gate opening 20. For example, when viewed in the cross-section illustrated in FIG. 1, the end part of gate electrode 30 may be positioned further from source electrode 28 than the upper end of side face 20b of gate opening 20, in the direction parallel to substrate 12. Specifically, the end part of gate electrode 30 may be positioned overlapping with side face 20b in the direction directly vertical therefrom, i.e., in a plan view.

In this case, the threshold voltage of nitride semiconductor device 1 is determined only by the configuration at the part following side face 20b of gate opening 20. This makes it possible to increase the carrier concentration of flat part 22c, and the on-resistance can therefore be reduced.

Variation

A variation on nitride semiconductor device 1 according to the present embodiment will be described next with reference to FIG. 2. The following descriptions will focus on the differences from nitride semiconductor device 1 according to Embodiment 1, and descriptions of common points will be omitted or simplified.

Figure 2:
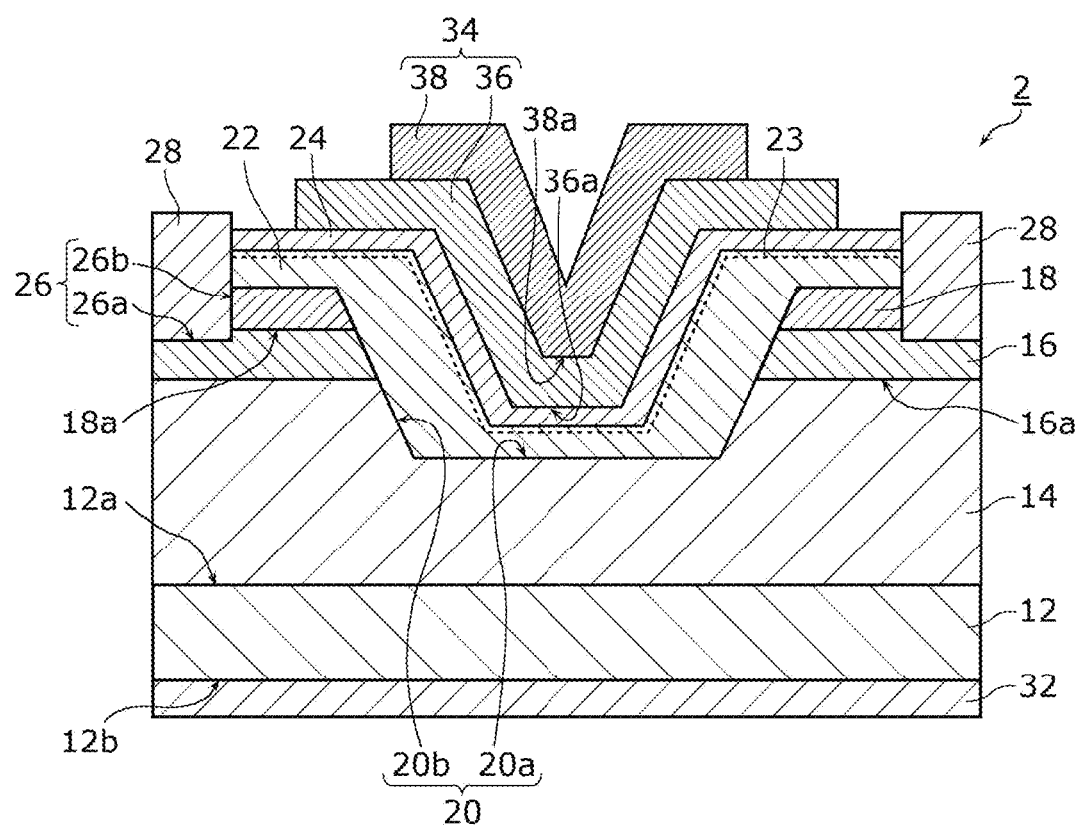
FIG. 2 is a cross-sectional view of a nitride semiconductor device according to a variation on Embodiment 1 of the present disclosure.

FIG. 2 is a cross-sectional view of nitride semiconductor device 2 according to the present variation. As illustrated in FIG. 2, nitride semiconductor device 2 according to the present variation differs from nitride semiconductor device 1 according to Embodiment 1 in that gate electrode 34 is provided instead of gate electrode 30. Gate electrode 34 includes threshold adjustment layer 36 and metal layer 38.

Threshold adjustment layer 36 is an example of a p-type third nitride semiconductor layer, provided between metal layer 38 and electron supply layer 24. Threshold adjustment layer 36 is provided on electron supply layer 24, and makes contact with electron supply layer 24 and metal layer 38.

Threshold adjustment layer 36 is, for example, a nitride semiconductor layer formed from p-type AlGaN with a thickness of 100 nm and a carrier concentration of $1 \times 10^{17}$ cm$^{-3}$. Threshold adjustment layer 36 is formed through MOVPE and patterning, after the process of forming electron supply layer 24.

Providing threshold adjustment layer 36 increases the potential at the end of the conducting band of the channel part. This makes it possible to increase the threshold voltage of nitride semiconductor device 2. Accordingly, nitride semiconductor device 2 can be implemented as a normally-off FET. In other words, nitride semiconductor device 2 can be turned off when a potential of 0 V is applied to gate electrode 34.

Note that threshold adjustment layer 36 need not be a p-type nitride semiconductor, and may be an insulating film such as a silicon nitride film, a silicon oxide film, or the like. Threshold adjustment layer 36 may be formed using any material as long as it is a material capable of increasing the channel potential.

Metal layer 38 is formed along an upper face of threshold adjustment layer 36 and in contact with the upper face of threshold adjustment layer 36, and is formed at a substantially uniform thickness. Metal layer 38 is formed using a metal material. For example, metal layer 38 is formed using the same material as gate electrode 30 according to Embodiment 1. Metal layer 38 is formed by patterning a conductive film formed through sputtering or vapor deposition, for example, after threshold adjustment layer 36 has been formed or patterned, after source opening 26 has been formed, or after source electrode 28 has been formed.

In the present variation, bottom face 36a of threshold adjustment layer 36 is closer to drain electrode 32 than bottom face 16a of blocking layer 16. Specifically, bottom face 36a of threshold adjustment layer 36 is located 0.1 μm closer to drain electrode 32 than bottom face 16a of blocking layer 16. Note that the numerical values pertaining to the depth are merely examples, and are not particularly limited. For example, the distance between bottom face 36a of threshold adjustment layer 36 and bottom face 16a of blocking layer 16 may be longer or shorter than 0.1 μm. Likewise, the distance between bottom face 36a of threshold adjustment layer 36 and bottom face 16a of blocking layer 16 may be at least 0.3 μm and no more than 1.8 μm.

Bottom face 38a of metal layer 38 may be closer to drain electrode 32 than bottom face 16a, or may be distanced from drain electrode 32. Alternatively, bottom face 38a of metal layer 38 may be at the same distance from drain electrode 32 as bottom face 16a.

Through this, an electrical field produced in a vertical direction of nitride semiconductor device 2 by applying a high potential to drain electrode 32 when nitride semiconductor device 2 is off concentrates easily at the bottom face of gate electrode 34, i.e., at bottom face 36a of threshold adjustment layer 36. Accordingly, as with nitride semiconductor device 1 according to Embodiment 1, electrical field concentration at end parts of blocking layer 16 (specifically, at the interface between blocking layer 16 and electron transport layer 22) can be alleviated.

Bottom face 36a of threshold adjustment layer 36 corresponds to an interface between threshold adjustment layer 36 and electron supply layer 24. In other words, a pn junction between threshold adjustment layer 36 and electron supply layer 24 is formed at bottom face 36a. Threshold adjustment layer 36 and electron supply layer 24 are formed through successive crystal regrowth, and thus impurities such as Si are almost entirely absent at bottom face 36a. Accordingly, even if an electrical field concentrates at bottom face 36a of threshold adjustment layer 36, the breakdown voltage of nitride semiconductor device 2 can be increased more than when an electrical field concentrates at the end parts of blocking layer 16.

Additionally, a pn junction is typically stronger with respect to a strong electrical field than a Schottky junction. The breakdown voltage of nitride semiconductor device 2 can therefore be made higher than the breakdown voltage of nitride semiconductor device 1.

Additionally, according to the present variation, when nitride semiconductor device 2 is off, a potential difference between gate electrode 34 and blocking layer 16, which is fixed to the source potential, is 0. As a result, degeneration of the barrier layer extending within electron transport layer 22 from blocking layer 16 is suppressed, and the channel narrowing effect increases. This makes it possible to sufficiently reduce leakage current when nitride semiconductor device 2 is off.

Embodiment 2

Embodiment 2 will be described next. The following descriptions will focus on the differences from Embodiment 1 and the variation thereon, and descriptions of common points will be omitted or simplified.

Figure 3:
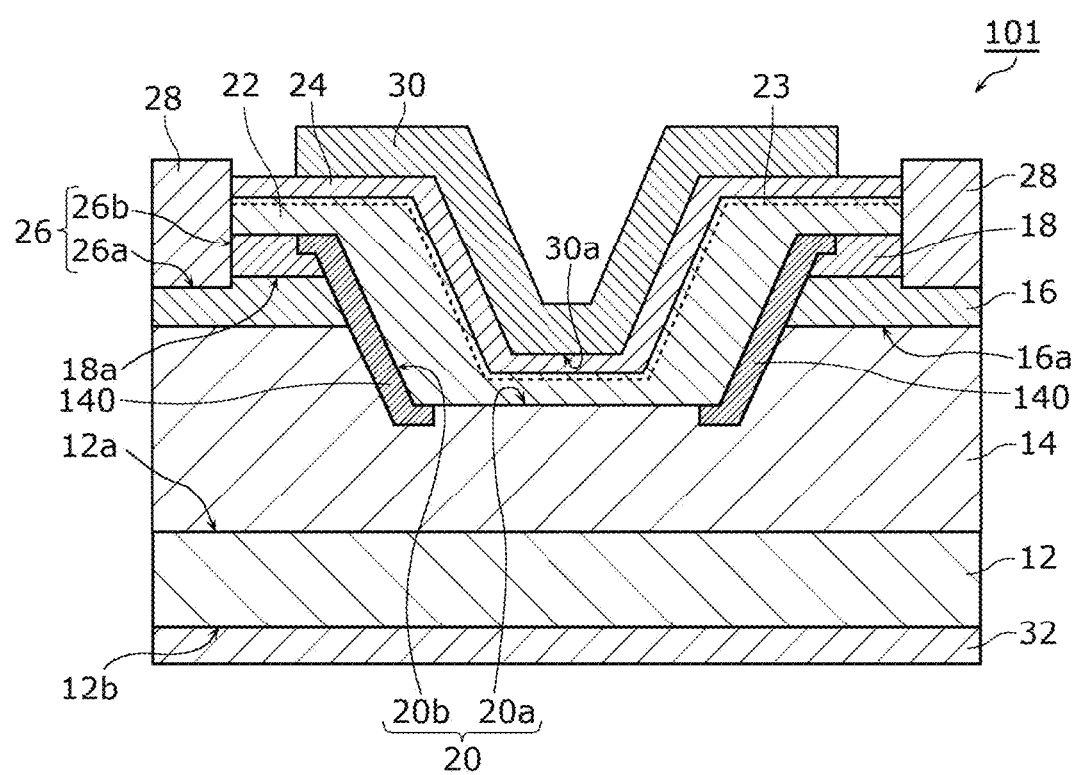
FIG. 3 is a cross-sectional view of a nitride semiconductor device according to Embodiment 2 of the present disclosure.

FIG. 3 is a cross-sectional view of nitride semiconductor device 101 according to the present embodiment. As illustrated in FIG. 3, nitride semiconductor device 101 differs from nitride semiconductor device 1 according to Embodiment 1 in that high-resistance layer 140 has been added.

High-resistance layer 140 is a high-resistance layer which is provided between blocking layer 16 and electron transport layer 22 along the inner face of gate opening 20, and which has a higher resistance than blocking layer 16. High-resistance layer 140 is provided from side face 20b of gate opening 20, across part of bottom face 20a. Specifically, high-resistance layer 140 is provided extending from an upper end part of gate opening 20, i.e., a part of the upper face of high-resistance layer 18, to part of bottom face 20a, so as to cover the entire surface of side face 20b. In other words, high-resistance layer 140 is provided between drift layer 14 and electron transport layer 22, between blocking layer 16 and electron transport layer 22, and between high-resistance layer 18 and electron transport layer 22.

To be more specific, an upper face of an upper end part of high-resistance layer 140 is flush with the upper face of high-resistance layer 18, as illustrated in FIG. 3. Additionally, an upper face of a lower end part of high-resistance layer 140 is flush with a part of the upper face of drift layer 14 which forms bottom face 20a. High-resistance layer 140 is formed so as to be embedded in a surface layer part and an end face part of high-resistance layer 18, an end face part of blocking layer 16, and a surface layer part of drift layer 14.

High-resistance layer 140 has a higher resistance value than blocking layer 16. High-resistance layer 140 and high-resistance layer 18 have the same resistance value. Alternatively, high-resistance layer 140 may have a higher or a lower resistance value than high-resistance layer 18.

High-resistance layer 140 is constituted by a nitride semiconductor. In the present embodiment, high-resistance layer 140 is a nitride semiconductor layer containing iron (Fe). High-resistance layer 140 is, for example, constituted by GaN which is doped with iron and has an increased resistance. High-resistance layer 140 is 50 nm thick, for example. For example, high-resistance layer 140 is formed by implanting Fe ions in a range including the end faces of blocking layer 16 after forming gate opening 20. Note that any ions may be implanted as long as they are ions capable of increasing the resistance of GaN, and may be B, C, or Mg. The dosage amount of impurity ions to be implanted is, for example, at least $1\times10^{12}$ cm$^{-2}$ and no more than $1\times10^{16}$ cm$^{-2}$, and may be at least $1\times10^{13}$ cm$^{-2}$ and no more than $1\times10^{14}$ cm$^{-2}$. The implantation energy is, for example, at least 10 keV and no more than 200 keV, and may be at least 20 keV and 50 keV.

With nitride semiconductor device 101 according to the present embodiment, providing high-resistance layer 140 makes it possible to suppress spreading of the barrier layer caused by the pn junction between blocking layer 16 and electron transport layer 22. Accordingly, narrowing of the channel caused by the barrier layer is suppressed when nitride semiconductor device 101 is on, which makes it possible to reduce the on-resistance and supply a greater current.

Note that providing high-resistance layer 140 also suppresses spreading of the barrier layer when nitride semiconductor device 101 is off. This results in a lower breakdown voltage than when high-resistance layer 140 is not provided. However, according to the present embodiment, bottom face 30a of gate electrode 30 is closer to drain electrode 32 than bottom face 16a of blocking layer 16, and thus the breakdown voltage of nitride semiconductor device 101 can be increased in the same manner as in Embodiment 1. In other words, the breakdown voltage can be kept high in the off state, even when high-resistance layer 140 is provided.

As described above, nitride semiconductor device 101 according to the present embodiment not only can reduce the on-resistance and achieve high-current operations in an on state, but also can increase the breakdown voltage and reduce leakage current in an off state.

Variation

A variation on nitride semiconductor device 101 according to the present embodiment will be described next with reference to FIG. 4. The following descriptions will focus on the differences from nitride semiconductor device 101 according to Embodiment 2, and descriptions of common points will be omitted or simplified.

Figure 4:
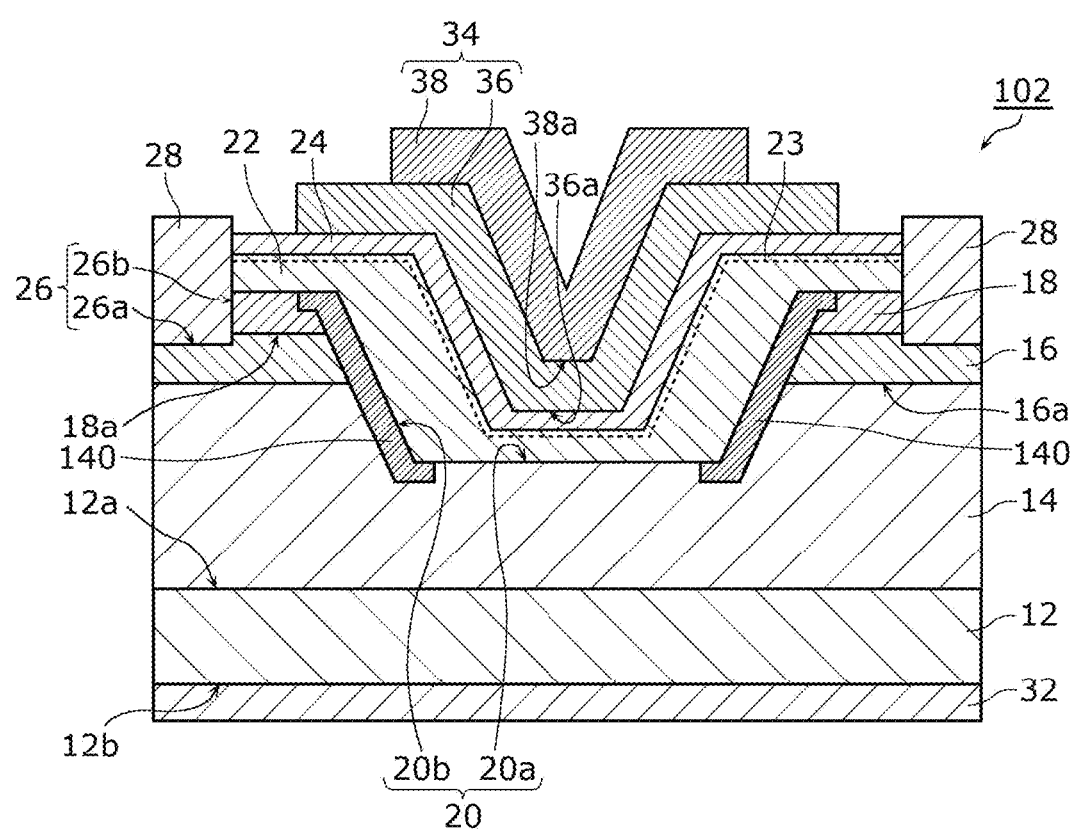
FIG. 4 is a cross-sectional view of a nitride semiconductor device according to a variation on Embodiment 2 of the present disclosure.

FIG. 4 is a cross-sectional view of nitride semiconductor device 102 according to the present variation. As illustrated in FIG. 4, nitride semiconductor device 102 according to the present variation differs from nitride semiconductor device 101 according to Embodiment 2 in that gate electrode 34 is provided instead of gate electrode 30. Gate electrode 34 is the same as gate electrode 34 according to the variation on Embodiment 1.

Accordingly, nitride semiconductor device 102 according to the present variation can be realized as a normally-off FET, in the same manner as nitride semiconductor device 2 according to the variation on Embodiment 1.

Embodiment 3

Embodiment 3 will be described next. The following descriptions will focus on the differences from Embodiments 1 and 2 and the variations thereon, and descriptions of common points will be omitted or simplified.

Figure 5:
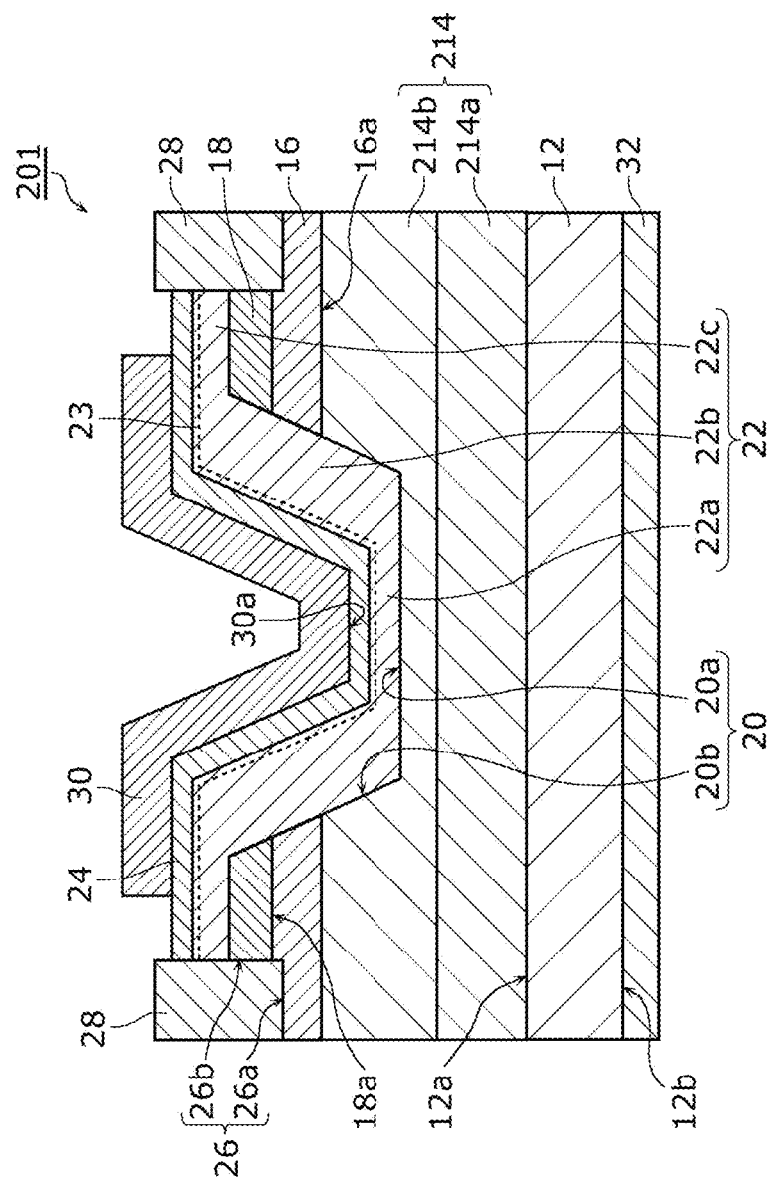
FIG. 5 is a cross-sectional view of a nitride semiconductor device according to Embodiment 3 of the present disclosure.

FIG. 5 is a cross-sectional view of nitride semiconductor device 201 according to the present embodiment. As illustrated in FIG. 5, nitride semiconductor device 201 differs from nitride semiconductor device 1 according to Embodiment 1 in that drift layer 214 is provided instead of drift layer 14.

In drift layer 214, the donor concentration has two different levels in the vertical direction of drift layer 214. Specifically, as illustrated in FIG. 5, drift layer 214 has high-concentration layer 214a and low-concentration layer 214b.

High-concentration layer 214a is an example of a first layer. In the present embodiment, high-concentration layer 214a is provided so as to be in contact with first main surface 12a of substrate 12.

Low-concentration layer 214b is an example of a second layer. In the present embodiment, low-concentration layer 214b is provided between high-concentration layer 214a and blocking layer 16, and is in contact with both. Low-concentration layer 214b has a lower donor concentration than high-concentration layer 214a.

In this manner, by making the donor concentration in low-concentration layer 214b on the blocking layer 16 side (the upper side) lower than the donor concentration in high-concentration layer 214a on the side closer to substrate 12 (the lower side), a barrier layer is prompted to extend into drift layer 214 when a high voltage is applied to drain electrode 32 in an off state. This alleviates electrical field concentration at bottom face 30a of gate electrode 30 or bottom face 16a of blocking layer 16.

In the present embodiment, bottom face 20a of gate opening 20 is positioned within low-concentration layer 214b. This makes it possible to more efficiently alleviate electrical field concentration at bottom face 30a of gate electrode 30. Note that bottom face 20a may be positioned within high-concentration layer 214a, and may be positioned at the interface between high-concentration layer 214a and low-concentration layer 214b.

Although the present embodiment describes an example in which drift layer 214 has two layers, drift layer 214 may be divided into three or four layers, or into five or more layers. Alternatively, drift layer 214 may have a multilayer structure in which the donor concentration gradually increases from the substrate 12 side toward the blocking layer 16 side, with the respective layers being sufficiently thin. In other words, a graded structure in which the donor concentration is gradually reduced from the substrate 12 side toward the blocking layer 16 side within drift layer 214 may be used. The same effects as those of the present embodiment can be achieved in such a case as well.

The donor concentration may be controlled by controlling the concentration of Si serving as the donor, or by controlling the concentration of C serving as the acceptor which compensates for Si. In sum, what is important is that there are multiple net donor concentrations within drift layer 214.

Variation

A variation on nitride semiconductor device 201 according to the present embodiment will be described next with reference to FIGS. 6 to 8. The following descriptions will focus on the differences from nitride semiconductor device 201 according to Embodiment 3, and descriptions of common points will be omitted or simplified.

Figure 6:
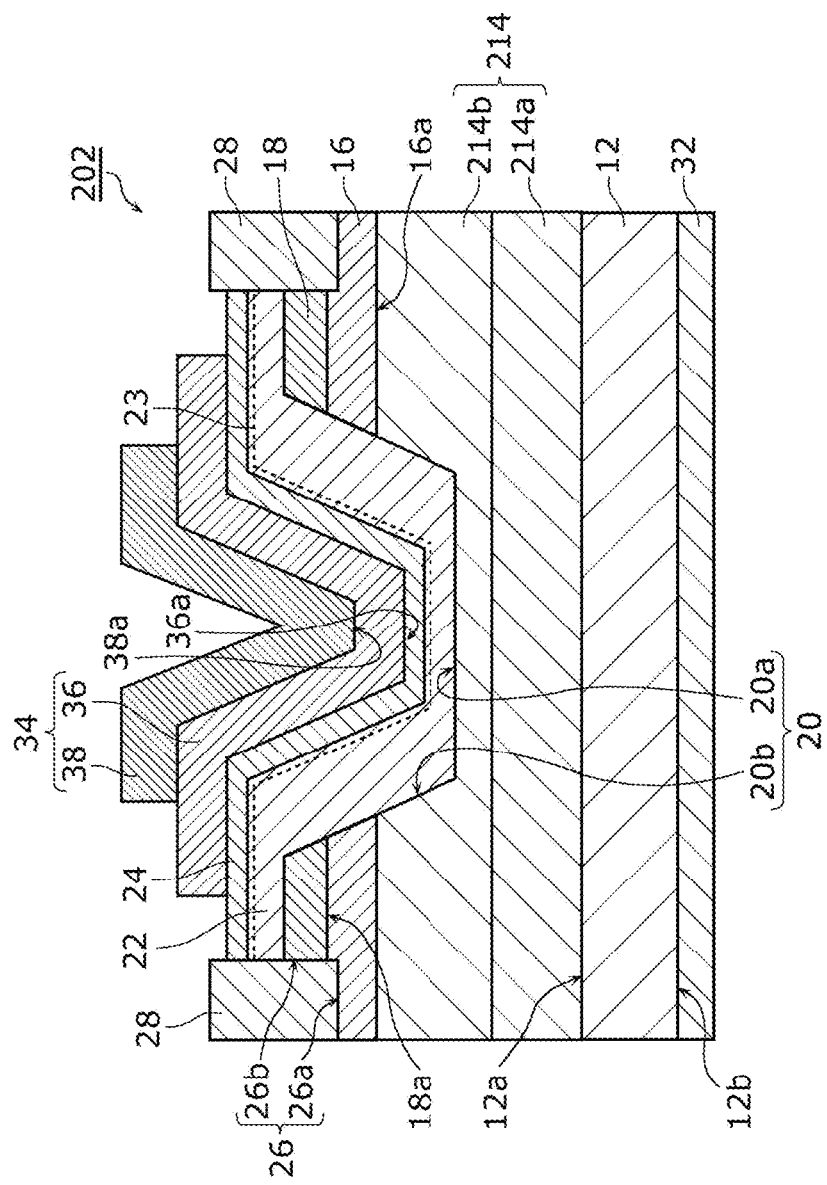
FIG. 6 is a cross-sectional view of a nitride semiconductor device according to a variation on Embodiment 3 of the present disclosure.

FIG. 6 is a cross-sectional view of nitride semiconductor device 202 according to Variation 1. As illustrated in FIG. 6, nitride semiconductor device 202 according to the present variation differs from nitride semiconductor device 201 according to Embodiment 3 in that gate electrode 34 is provided instead of gate electrode 30. Gate electrode 34 is the same as gate electrode 34 according to the variation on Embodiment 1.

Accordingly, nitride semiconductor device 202 according to the present variation can be realized as a normally-off FET, in the same manner as nitride semiconductor device 2 according to the variation on Embodiment 1.

Figure 7:
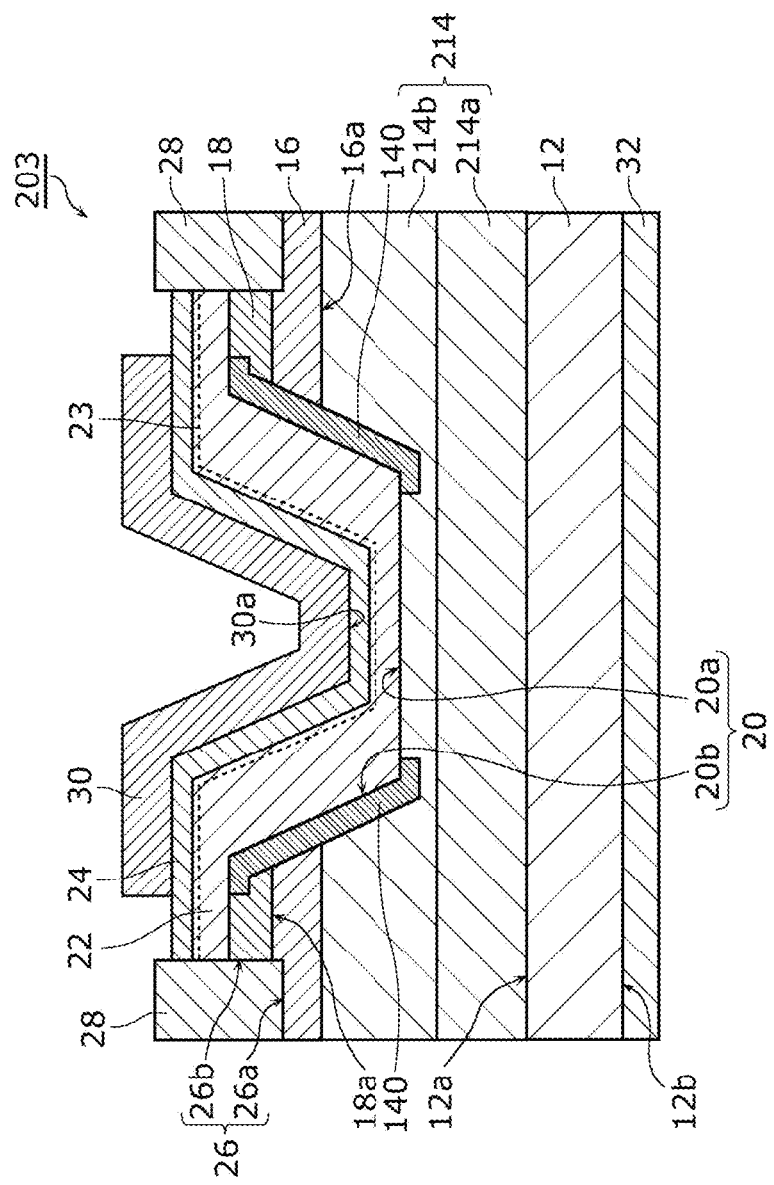
FIG. 7 is a cross-sectional view of a nitride semiconductor device according to a variation on Embodiment 3 of the present disclosure.

FIG. 7 is a cross-sectional view of nitride semiconductor device 203 according to Variation 2. As illustrated in FIG. 7, nitride semiconductor device 203 according to the present variation differs from nitride semiconductor device 201 according to Embodiment 3 in that high-resistance layer 140 has been added. High-resistance layer 140 is the same as high-resistance layer 140 according to Embodiment 2.

Thus, like nitride semiconductor device 101 according to Embodiment 2, nitride semiconductor device 203 according to the present variation not only can reduce the on-resistance and achieve high-current operations in an on state, but also can increase the breakdown voltage and reduce leakage current in an off state.

Figure 8:
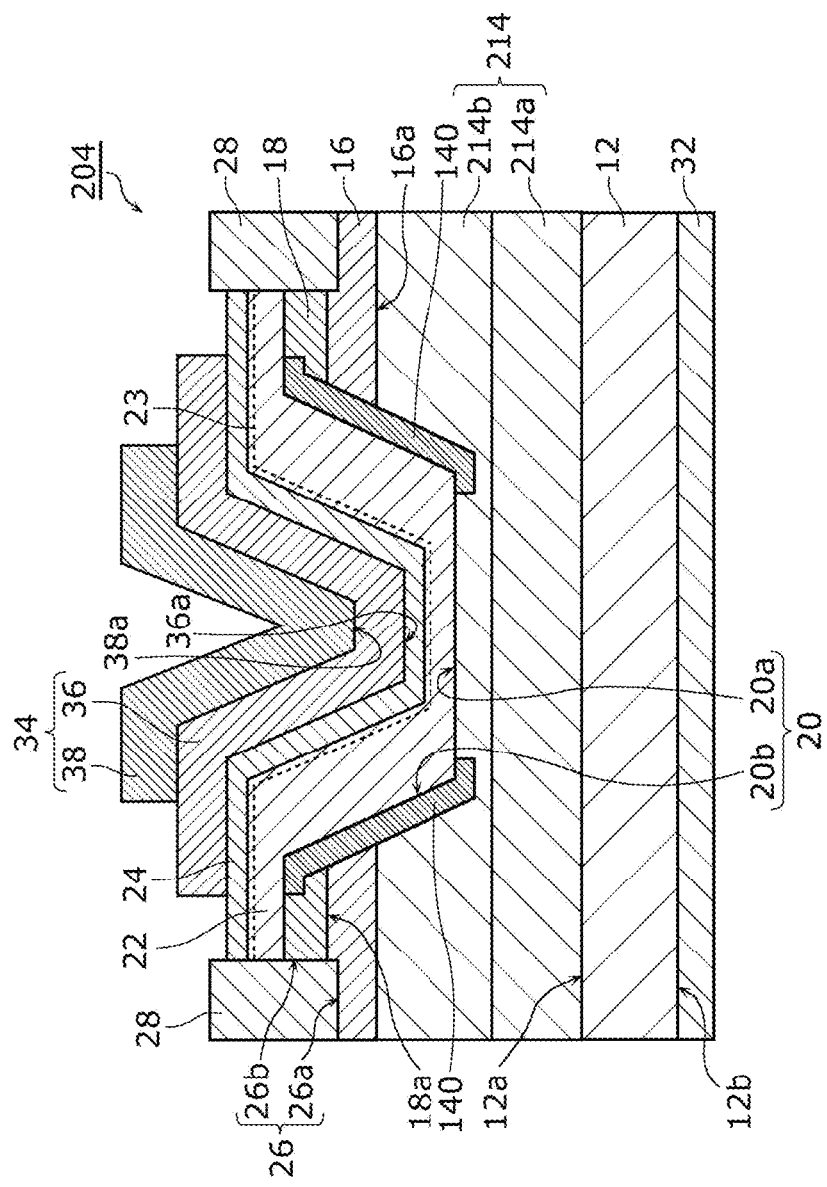
FIG. 8 is a cross-sectional view of a nitride semiconductor device according to a variation on Embodiment 3 of the present disclosure.

FIG. 8 is a cross-sectional view of nitride semiconductor device 204 according to Variation 3. As illustrated in FIG. 8, nitride semiconductor device 204 according to the present variation differs from nitride semiconductor device 203 according to Variation 2 on Embodiment 3 in that gate electrode 34 is provided instead of gate electrode 30. Gate electrode 34 is the same as gate electrode 34 according to the variation on Embodiment 1.

Accordingly, nitride semiconductor device 204 according to the present variation can be realized as a normally-off FET, in the same manner as nitride semiconductor device 2 according to the variation on Embodiment 1.

Other Embodiments

Although one or more aspects of a nitride semiconductor device have been described thus far on the basis of embodiments, the present disclosure is not intended to be limited to these embodiments. Variations on the present embodiment conceived by one skilled in the art and embodiments implemented by combining constituent elements from different other embodiments, for as long as they do not depart from the essential spirit thereof, fall within the scope of the present disclosure.

For example, when the influence of the parasitic bipolar transistor formed by electron transport layer 22, blocking layer 16, and drift layer 14 is sufficiently low, nitride semiconductor device 1, 2, 101, or 102 need not include high-resistance layer 18.

Additionally, for example, nitride semiconductor device 1, 2, 101, or 102 need not include source opening 26, and source electrode 28 may be provided on electron supply layer 24 at a distance from gate electrode 30.

For example, although the foregoing Embodiments 3 and 4 describe an example in which high-resistance layer 140 is provided on the entirety of side face 20b of gate opening 20, the configuration is not limited thereto. High-resistance layer 140 may be provided only on end faces of blocking layer 16 (i.e., the parts exposed in gate opening 20).

Additionally, many changes, substitutions, additions, omissions, and the like are possible for the foregoing embodiments without departing from the scope of the claims or a scope equivalent thereto.

INDUSTRIAL APPLICABILITY

The nitride semiconductor device according to the present disclosure can be used, for example, as a power device such as a power transistor or the like employed in power circuitry of consumer devices such as televisions.

The invention claimed is:

1. A nitride semiconductor device, comprising:
a substrate;
a first nitride semiconductor layer above the substrate, the first nitride semiconductor layer being of an n-type;
a second nitride semiconductor layer above the first nitride semiconductor layer, the second nitride semiconductor layer being of a p-type;
a first opening which penetrates through the second nitride semiconductor layer to the first nitride semiconductor layer;
an electron transport layer and an electron supply layer disposed on an inner face of the first opening, in the stated order from a side on which the substrate is located;
a gate electrode above the electron supply layer and covering the first opening;
a second opening at a position distanced from the first opening, the second opening penetrating through the electron supply layer and the electron transport layer to the second nitride semiconductor layer;
a source electrode covering the second opening, the source electrode being connected to the electron supply layer, the electron transport layer, and the second nitride semiconductor layer; and
a drain electrode on a side of the substrate opposite from a side of the substrate on which the first nitride semiconductor layer is located,
wherein a bottom face of the gate electrode is closer to the drain electrode than a bottom face of the second nitride semiconductor layer is, and
wherein the gate electrode includes:
a metal layer including a metal material; and
a third nitride semiconductor layer between the metal layer and the electron supply layer, the third nitride semiconductor layer being of a p-type,
wherein a bottom face of the third nitride semiconductor layer is closer to the drain electrode than the bottom face of the second nitride semiconductor layer is.

2. The nitride semiconductor device according to claim 1, further comprising:
a high-resistance layer between the second nitride semiconductor layer and the electron transport layer on the inner face of the first opening, the high-resistance layer having a resistance higher than a resistance of the second nitride semiconductor layer.

3. The nitride semiconductor device according to claim 2, wherein the high-resistance layer is a nitride semiconductor layer containing Fe.

4. The nitride semiconductor device according to claim 1, wherein the first nitride semiconductor layer includes:

a first layer; and a second layer above the first layer, the second layer having a lower donor concentration than the first layer.

* * * * *